United States Patent [19]

Iwata et al.

[11] 4,442,456
[45] Apr. 10, 1984

[54] SOLID-STATE IMAGING DEVICE

[75] Inventors: Yoshio Iwata, Tachikawa; Tsutomu Fujita, Mobara; Tsunehisa Horiuchi; Youichi Shimizu, both of Kodaira, all of Japan

[73] Assignee: Hitachi, Ltd., Tokyo, Japan

[21] Appl. No.: 265,809

[22] Filed: May 21, 1981

[30] Foreign Application Priority Data

Jun. 2, 1980 [JP] Japan .................... 55-72761

[51] Int. Cl.³ .............................................. H04N 3/14
[52] U.S. Cl. .................... 358/213; 250/211 J; 250/578
[58] Field of Search .......................... 358/213, 41, 44; 357/30; 250/211 R, 211 J, 578

[56] References Cited

U.S. PATENT DOCUMENTS 3,576,392 4/1971 Hofstein ............................. 358/213
4,025,954 5/1977 Bert ..................................... 358/213
4,040,092 8/1977 Carnes ................................ 358/213

FOREIGN PATENT DOCUMENTS 55-159677 12/1980 Japan .................................. 358/213

Primary Examiner—Tommy P. Chin
Attorney, Agent, or Firm—Charles E. Pfund

[57] ABSTRACT

An accommodation portion of a solid-state imaging device having a recessed shape in section is so formed in a package such that the center thereof is deviated from the center of the package. A light-receiving element having a light-receiving portion as well as a circuit portion for driving the light-receiving portion that are formed on the same plane, is so disposed in the accommodation portion such that the center of the light-receiving portion is in agreement with the center of the package. The outer diameter of the imaging device can be reduced, and the imaging center can be brought into agreement with the center of the light-receiving portion.

2 Claims, 4 Drawing Figures

4,442,456

SOLID-STATE IMAGING DEVICE

BACKGROUND OF THE INVENTION

The present invention relates to a solid-state imaging device, and more specifically to a solid-state imaging device of a package construction having reduced external sizes.

FIGS. 1A and 1B are a plan view and a sectional view of a conventional solid-state imaging device, in which a package 1 made of a ceramic material or the like has in a central portion thereof a recessed portion 1c for accommodating a solid-state imaging element, the recessed portion being defined by a stepped portion 1a and a bottom portion 1b. Bonding pads 2 are applied on the predetermined positions of the stepped portion 1a. Bonding pads 2 are connected to electrically conductive metal patterns 3 that are formed in the package 1, and are further connected to lead terminals 4 for connection to external units, that are arrayed on the side surfaces of the package 1. Further, a light-receiving element 5 is adhered onto the bottom portion 1b in the recessed portion 1c of the package 1 with a light-receiving portion 5a being directed toward the front. Bonding pads 5b formed on the light-receiving element 5 are connected via bonding wires 6 to the bonding pads 2 that are formed on the stepped portion 1a of the package 1. Further, shift registers 5c are formed around the periphery of the light-receiving element 5 to drive the light-receiving portion 5a. In order to prevent the light-receiving element 5 from being deteriorated, the open end or the front side of the package 1 is air-tightly sealed with a transparent glass plate 8 via a sealing agent 7. Shift registers 5c consist of integrated circuits of a complicated circuit construction as shown in FIG. 2. In practice, therefore, it is very difficult to change the arrangement of the light-receiving portion 5a and the shift registers 5c in the light-receiving element having a small area. Accordingly, the relation in position between the light-receiving portion 5a and the shift registers 5c has been standardized as shown in FIG. 1A. A distance l has also been specified between the edge of the light-receiving element 5 and the stepped portion 1a. According to the conventional imaging device which is illustrated more clearly in FIG. 1B, a center axis $C_1$ of the light-receiving element 5 is brought into agreement with a center axis $C_2$ of the recessed portion 1c (which also is a center axis of the package 1 or the imaging device), and a center axis $C_3$ of the light-receiving portion 5a is deviated by a distance d from the center axis $C_2$ of the recessed portion 1c or from the center axis $C_1$ of the light-receiving element 5. In this case, furthermore, the transparent glass plate 8 is centered with the center axis $C_1$ of the light-receiving element 5 in a symmetrical manner in the upper and lower directions and in the right and left directions.

With thus constructed solid-state imaging device, however, since the center axis $C_3$ of the light-receiving portion 5a of the light-receiving element 5 is not in agreement with the center axis $C_2$ of the recessed portion 1c, i.e., since the center axis $C_3$ is deviated by a distance d from the center axis $C_2$, it is necessary to employ the transparent glass plate 8 having an area which is greater than the area of an aperture required for covering the incident angle $\theta$ of light. Consequently, the outer size of the package 1 tends to be inevitably increased. Furthermore, when the solid-state imaging element is to be mounted on a camera, the center axis of the lens of the camera must be brought into agreement with the center axis of the light-receiving portion of the element. For this purpose, the package must be offset inevitably by a distance d relative to the lens of the camera.

SUMMARY OF THE INVENTION

An object of the present invention is to provide a solid-state imaging device in which the center axis of the light-receiving portion is brought into agreement with the center axis of the transparent glass plate, so that the outer diameter of the transparent glass plate, i.e., the outer diameter of the package can be reduced without reducing the required area of the aperture to contribute to the reduction in size and weight, and in which in mounting the device on a camera, the center of the light-receiving portion can easily be brought into agreement with the center of the lens by centering the package with the lens.

According to the present invention, there is provided a solid-state imaging device comprising a light-receiving element which has a light-receiving portion and a circuit portion for driving the light-receiving portion, which are formed on the same plane, and a package which has an accommodation portion of a recessed shape in cross-section to accommodate the light-receiving element in such a manner that the bottom surface of the light-receiving element is adhered onto the accommodation portion, wherein the center of the light-receiving portion of the light-receiving element is brought into agreement with the imaging center of the imaging device.

DESCRIPTION OF THE PREFERRED EMBODIMENT

Figure 1A:
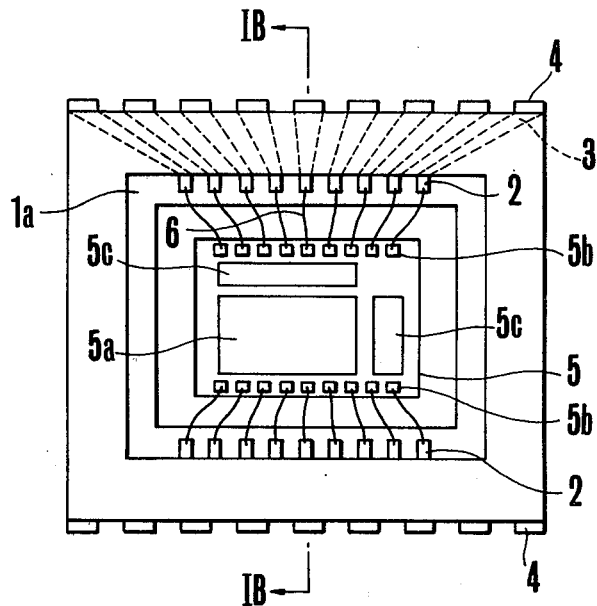
FIG. 1A is a plan view showing a conventional solid-state imaging device.
Figure 1B:
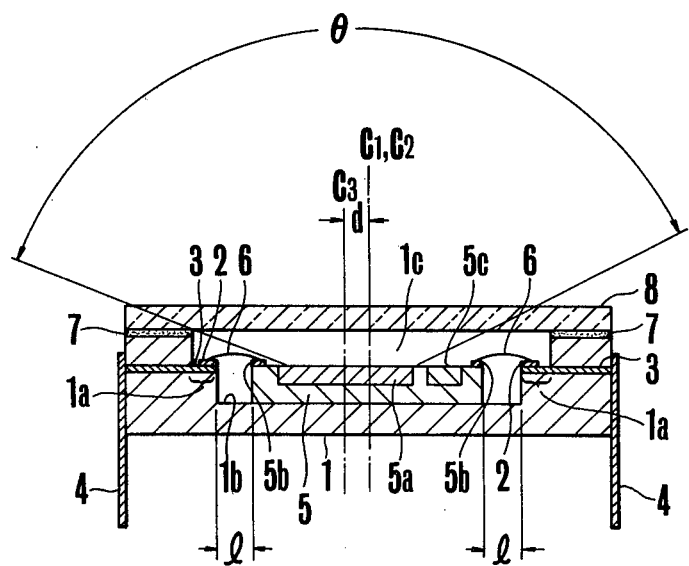
FIG. 1B is a sectional view along line IB—IB of FIG. 1A.
Figure 2:
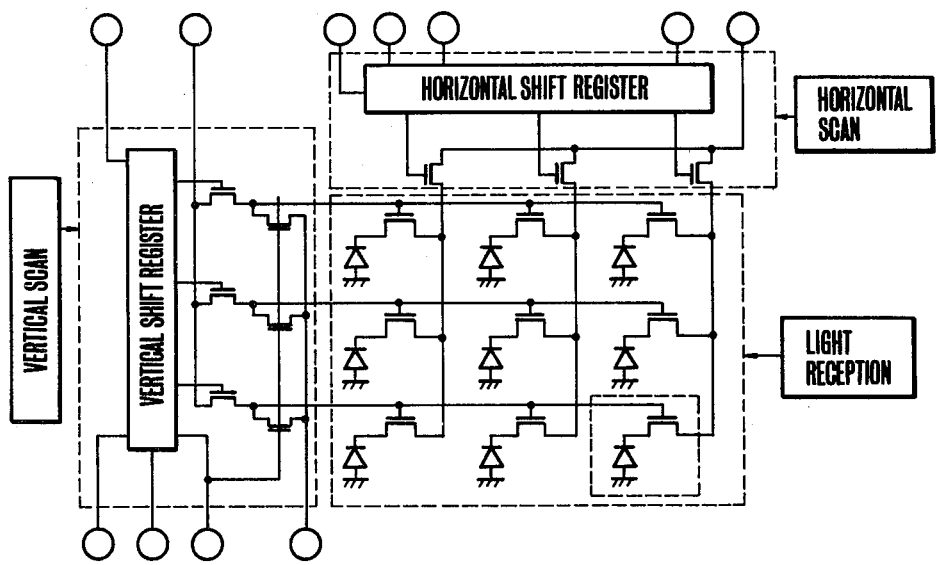
FIG. 2 is a circuit diagram showing the circuit setup of shift registers of FIGS. 1A, 1B.
Figure 3:
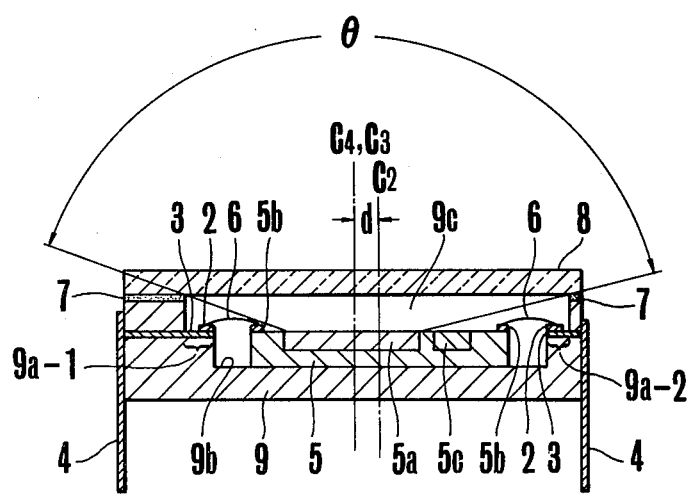
FIG. 3 is a sectional view showing a solid-state imaging device according to an embodiment of the present invention.

FIG. 3 illustrates a solid-state imaging element according to an embodiment of the present invention, in which the same reference numerals and symbols as those of FIGS. 1A and 1B denote the same elements, and are not described in greater detail here. In FIG. 3, the package 9 has in its central portion a recessed portion 9c for accommodating the solid-state imaging element, the recessed portion 9c being composed of a bottom portion 9b and stepped portions 9a-1, 9a-2 of different width, and the center axis $C_2$ of the recessed portion 9c being deviated from the center axis $C_4$ of the imaging device by a distance d. In the recessed portion 9c is secured the light-receiving element 5, the center axis $C_3$ of the light-receiving portion 5a being in agreement with the center axis $C_4$ of the imaging device, i.e., being in agreement with the center axis of the package 9.

According to the above-mentioned construction in which the center axis $C_3$ of the light-receiving portion 5a is brought into agreement with the center axis of the transparent glass plate 8 (center axis of the imaging device), it is possible to minimize the size of the transparent glass plate 8 relative to the incident angle θ of the light. Consequently, the outer diameter of the package 9 can be reduced correspondingly, to reduce the size and weight of the device. When the device is to be mounted on a camera, the center of the light-receiving portion can be easily brought into agreement with the center of the lens by simply centering the package with the lens.

Below is mentioned how much the outer diameter of the image device can be reduced according to the present invention when the amount of deviation is 0.35 mm. When the axis is deviated by 0.35 mm, reduction in outer diameter can be calculated to be 0.7 mm (0.35×2). In practice, however, the outer diameter can be reduced by more than 0.7 mm. The pattern, in practice, must be cut in a unit of 1/10 inch (2.54 mm). Therefore, if the diameter according to the conventional art is 22.86 mm, the diameter according to the present invention is 20.32 mm which is a reduction of 2.54 mm. Namely, the package can be obtained having an outer diameter which is smaller than the conventional package by one rank.

Although the above-mentioned embodiment has dealt with the case employing a ceramic package which has a recessed portion in section to accommodate the solid-state imaging element, it should be noted that the invention is by no means limited to such an embodiment only. According to the present invention, it is also possible to obtain quite the same effects as mentioned above by using a package of a construction in which the solid-state imaging device is adhered onto a plate, a spacer is so disposed as to surround the periphery of the solid-state imaging element, and the opening of the spacer is sealed by the transparent glass plate.

Although the above-mentioned embodiment has dealt with the case when the MOS-type solid-state imaging device was used, the present invention should in no way be limited thereto. The effects which are the same as those of the aforementioned embodiment can be obtained even when the CCD-type solid-state imaging device is used.

According to the present invention as described in the foregoing, the outer diameter of the package can be reduced to obtain the device in reduced size and in reduced weight without degrading the required area of the aperture of the transparent glass plate. In mounting the device on the camera, furthermore, the center of the package can be brought into agreement with the center of the lens to easily bring the center of the light-receiving portion into agreement with the center of the lens.

What is claimed is:

1. In a solid-state imaging device comprising a light-receiving element which has a light-receiving portion and a circuit portion for driving said light-receiving portion, that are formed on the same plane, and a package which has an accommodation portion of a recessed shape in section to accommodate said light-receiving element in such a manner that the bottom surface of said light-receiving element is adhered onto the accommodation portion, the improvement wherein the center axis of the light-receiving portion of said light-receiving element is brought into agreement with the center axis of said imaging device.

2. In a solid state imaging device comprising a light-receiving element which has a light-receiving portion and a circuit portion for driving said light-receiving portion, that are formed on the same plane, and a package which has an accommodation portion of a recessed shape in section to accommodate said light-receiving element in such a manner that the bottom surface of said light-receiving element is adhered onto the accommodation portion, the improvement wherein the center axis of the recessed portion of the package is deviated from the center axis of the package, and the light-receiving element is so secured onto said recessed portion that the center axis of said light-receiving element is in agreement with the center axis of said imaging device.

* * * * *